(12) United States Patent
Bieser et al.

(10) Patent No.: US 12,367,644 B2
(45) Date of Patent: *Jul. 22, 2025

(54) OPTIMIZING DISTANCE CALCULATIONS FOR OBJECTS IN THREE-DIMENSIONAL VIEWS

(71) Applicant: Procore Technologies, Inc., Carpinteria, CA (US)

(72) Inventors: Scott Bieser, Alameda, CA (US); Winson Chu, Alameda, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/487,822

(22) Filed: Oct. 16, 2023

(65) Prior Publication Data
US 2024/0153210 A1    May 9, 2024

Related U.S. Application Data

(63) Continuation of application No. 17/855,948, filed on Jul. 1, 2022, now Pat. No. 11,790,608, which is a
(Continued)

(51) Int. Cl.
*G06T 17/20*      (2006.01)
*G06F 3/0481*   (2022.01)
*G06T 7/90*       (2017.01)

(52) U.S. Cl.
CPC .............. *G06T 17/20* (2013.01); *G06F 3/0481* (2013.01); *G06T 7/90* (2017.01); *G06T 2200/24* (2013.01)

(58) Field of Classification Search
CPC ....... G06T 17/20; G06T 7/90; G06T 2200/24; G06T 19/00; G06F 3/0481;
(Continued)

(56) References Cited

U.S. PATENT DOCUMENTS

2002/0107673 A1    8/2002   Haller et al.
2016/0147408 A1*  5/2016   Bevis ................... G02B 27/017
                                                        715/850
2020/0364390 A1* 11/2020  Larsen .................... G06F 17/18

FOREIGN PATENT DOCUMENTS

JP         09044696 A    *  2/1997

OTHER PUBLICATIONS

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

* cited by examiner

*Primary Examiner* — William A Beutel
(74) *Attorney, Agent, or Firm* — Lee Sullivan Shea & Smith LLP

(57) ABSTRACT

A computing system configured to: (1) render, via a graphical user interface (GUI) displayed by a client station, a three-dimensional view of a construction project using a three-dimensional model file that defines a set of meshes representing physical objects of the construction project, wherein each mesh comprises a set of triangular faces, and wherein the GUI includes a measurement tool for obtaining a shortest distance between a first mesh and a second mesh; (2) receive a request to obtain the shortest distance between the first mesh and the second mesh; (3) calculate a set of distances potentially comprising the shortest distance between the first mesh and the second mesh by first reducing one or both of: (i) the number of faces between which distances are calculated and (ii) the number of distances that are calculated; and (4) determine the shortest distance between the first mesh and the second mesh.

20 Claims, 9 Drawing Sheets
(6 of 9 Drawing Sheet(s) Filed in Color)

Related U.S. Application Data continuation of application No. 17/100,410, filed on Nov. 20, 2020, now Pat. No. 11,380,059.

(58) Field of Classification Search
CPC ............... G06F 3/04815; G06F 3/0482; G06F 3/04842; G06F 30/12; G06F 30/13
See application file for complete search history.

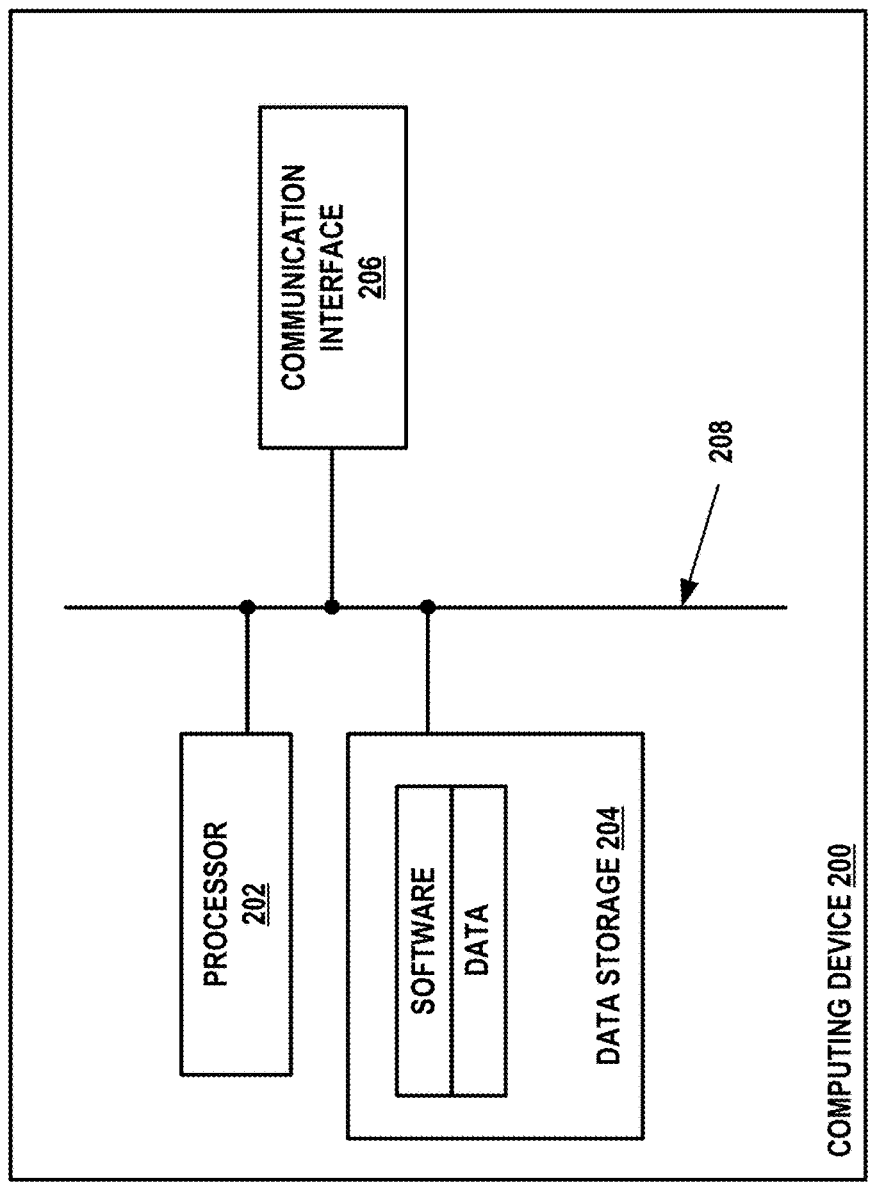

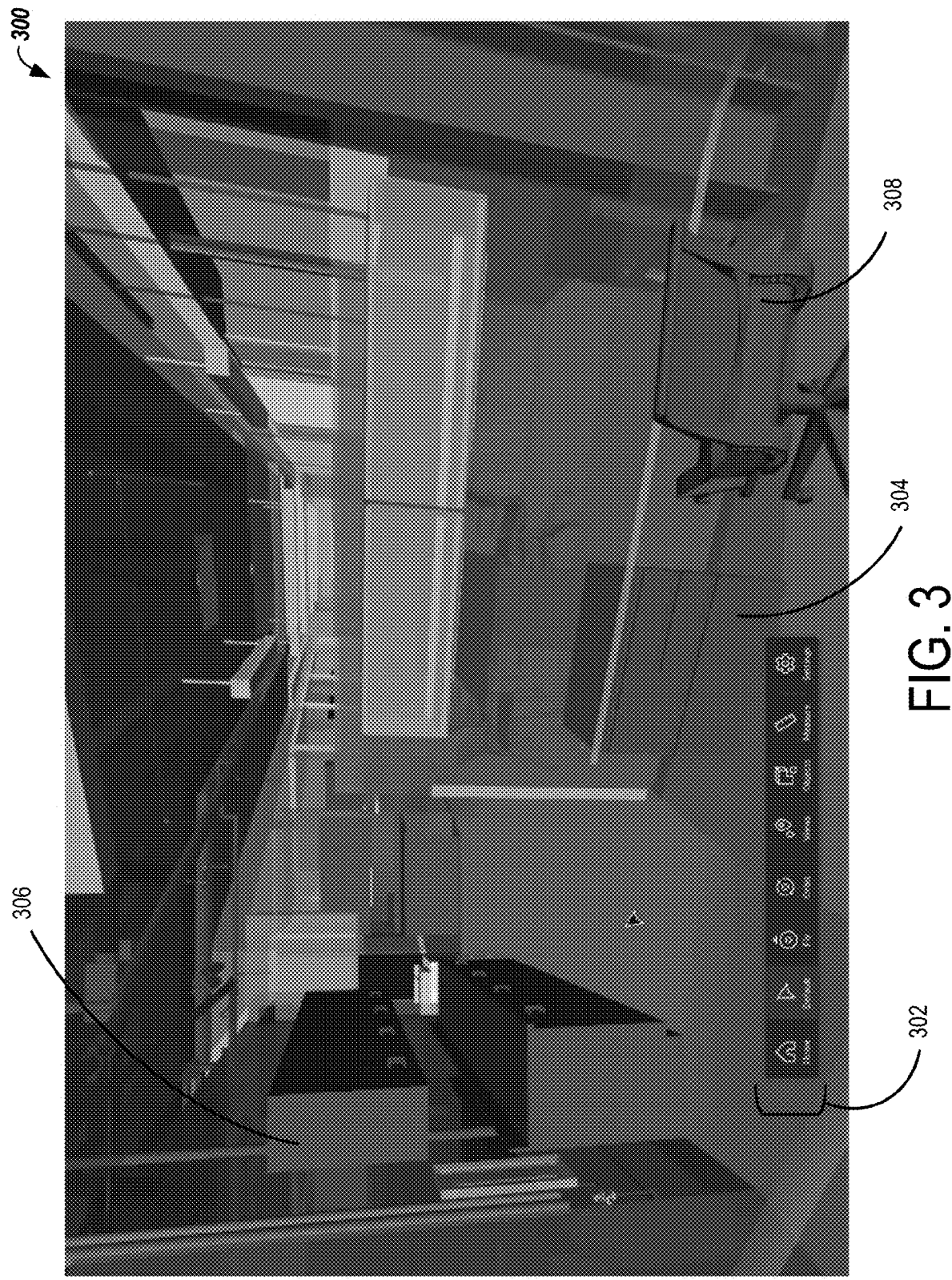

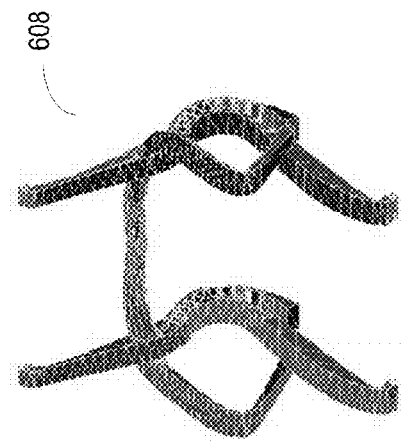
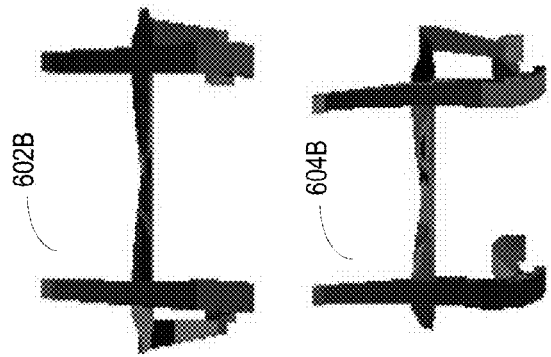
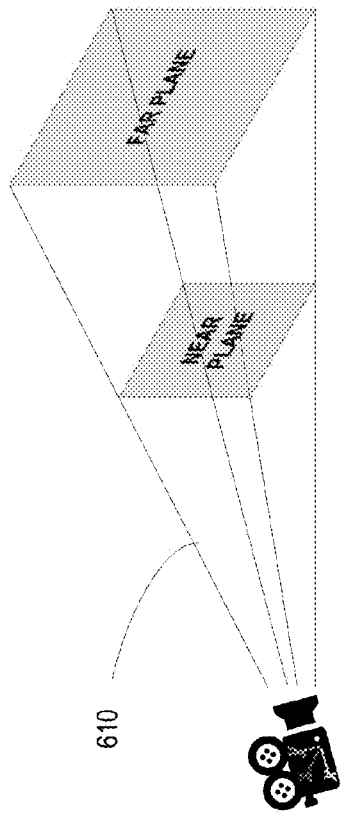
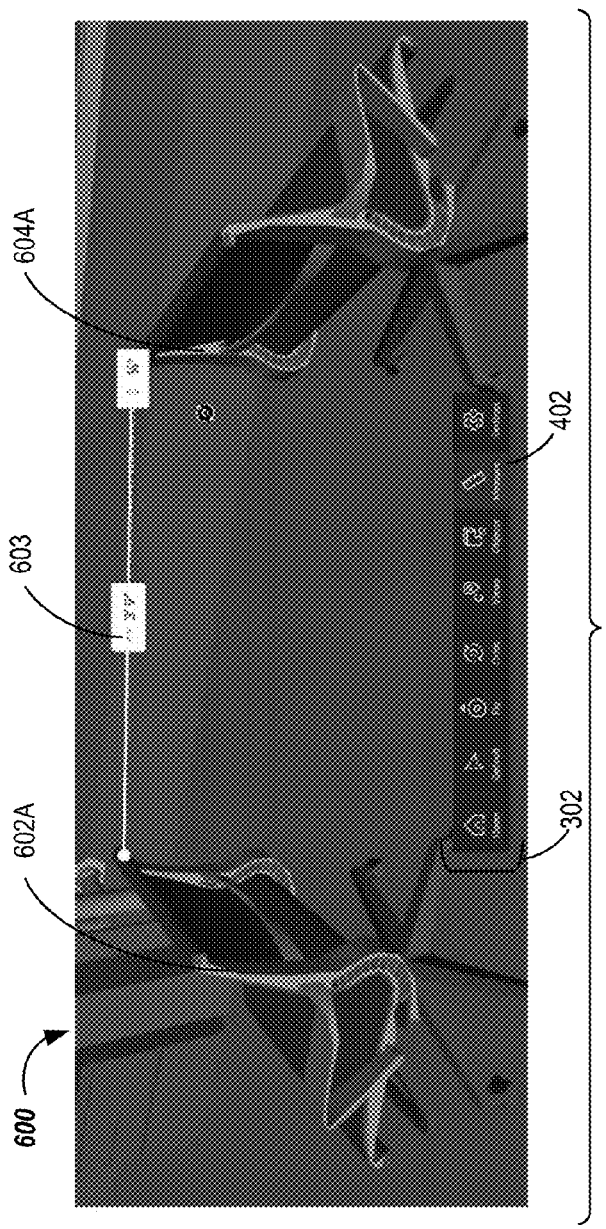
FIG. 6A
FIG. 6B
FIG. 6C
FIG. 6D

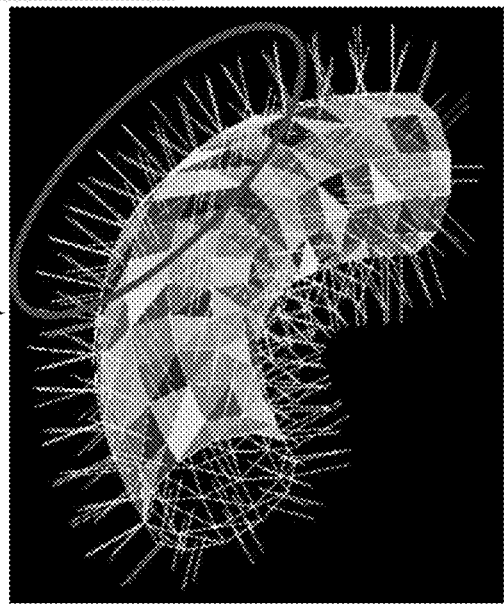
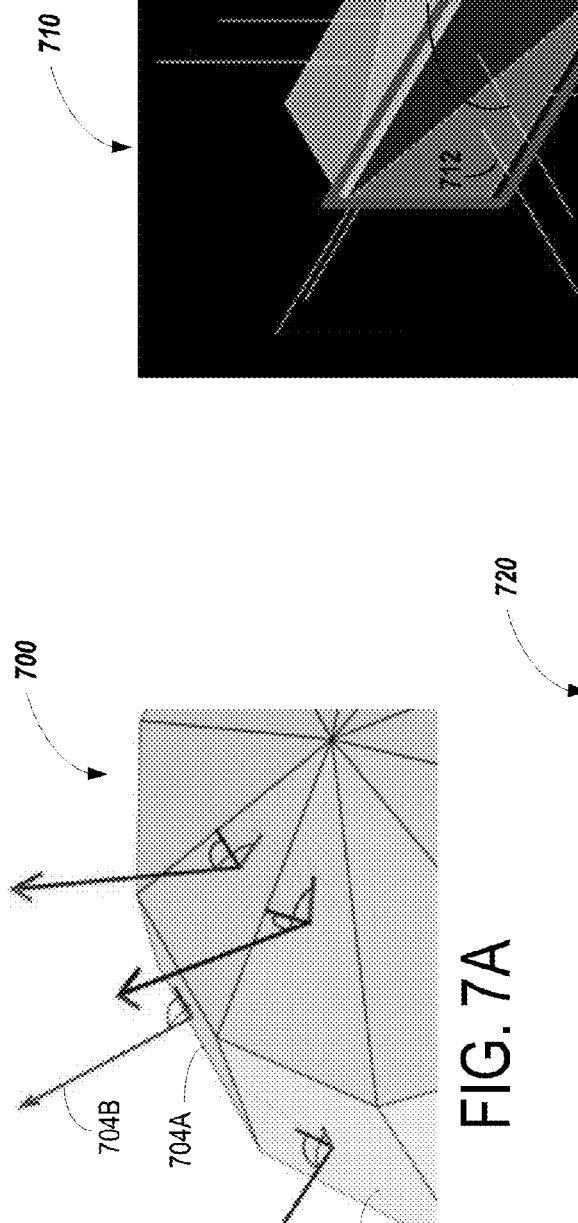
FIG. 7A
FIG. 7B

OPTIMIZING DISTANCE CALCULATIONS FOR OBJECTS IN THREE-DIMENSIONAL VIEWS

CROSS-REFERENCE TO RELATED APPLICATIONS

This application claims priority to, and is a continuation of, U.S. application Ser. No. 17/855,948, filed Jul. 1, 2022, and entitled "Computer System and Methods for Optimizing Distance Calculation," which is a continuation of U.S. application Ser. No. 17/100,410, filed Nov. 20, 2020, issued as U.S. Pat. No. 11,380,059, and entitled "Computer System and Methods for Optimizing Distance Calculation," the contents of each of which are herein incorporated by reference in their entirety.

BACKGROUND

Construction projects are often complex endeavors involving the coordination of many professionals across several discrete phases. Typically, a construction project commences with a design phase, where architects design the overall shape and layout of a construction project, such as a building. Next, engineers step in during a planning phase where they take the architects' designs and produce engineering drawings and plans for the construction of the project. At this stage, engineers may also design various portions of the project's infrastructure, such as HVAC, plumbing, electrical, etc., and produce plans reflecting these designs as well. After, or perhaps in conjunction with, the planning phase, contractors may step in during a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

Overview

As a general matter, one phase of a construction project involves the creation, review, and sometimes revision, of plans of the construction project. In most cases, these plans comprise visual representations of the construction project that visually communicate information about the construction project, such as how to assemble or construct the project. Such visual representations tend to take one of at least two different forms. One form may be a two-dimensional technical drawing, such as an architectural drawing or a construction blueprint, in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.).

To advance over two-dimensional technical drawings, computerized, three-dimensional technology was developed as another form in which information about a construction project can be visually communicated. In this respect, a three-dimensional model of the construction project is typically embodied in a computerized form, such as in a building information model (BIM) file visually representing each individual physical object in the construction project (e.g., an air duct or a cabinet) as a mesh of geometric triangles. A mesh is a collection of vertices, edges, and faces. A point is a position in three-dimensional space that can be represented by a set of x-, y-, z-coordinates. An edge is a line segment that joins two points. A point that is joined by two (or more) edges to form an angle is a vertex. A face is a triangle formed by three vertices connected by three edges. A given mesh may be comprised of thousands, tens of thousands, or even hundreds of thousands of individual faces, where each face may have a respective set of three vertices and three edges and corresponding sets of x-, y-, z-coordinates for each vertex and each edge.

Correspondingly, specialized software (such as the construction management software offered by Procore Technologies, Inc., who is the assignee of the present application) has been developed that is capable of accessing a BIM file, based on the BIM file, rendering a three-dimensional view of the construction project from one or more perspectives, and providing an ability to extract data from the rendered three-dimensional view.

For example, one type of data that may be extracted using such software tools is a measurement of the physical real-world distance between two objects depicted in the three-dimensional view. Therefore, many software tools provide an ability to determine the distance between two objects depicted in the three-dimensional view. Typically, the distance between two objects comprises the shortest distance between those objects. The ability to retrieve the distance between a pair of objects (e.g., the shortest distance between the two objects) can be useful in various ways during the planning and construction phases of a construction project.

Software tools typically determine the distance between two objects in a three-dimensional view by calculating distances between various points on a first object and various points on a second object, comparing the calculated distances, and identifying the distance that is the shortest (e.g., smallest measurement). Existing approaches for calculating the shortest distance between two objects generally involve finding various pairs of points, where each pair comprises a first point on a first object and a second point on a second object, calculating the distance between each pair of points, and comparing all of the calculated distances to determine which pair of points comprise the shortest distance between the first object and second object. To ensure that the shortest distance is found, existing approaches typically perform calculations based on two different types of analyses—vertex-to-face and edge-to-edge—in order to identify each pair of points and corresponding distance that may comprise the shortest distance between the two objects. These analyses are explained in more detail below.

A vertex-to-face analysis considers that the shortest distance between the two objects may lie between a vertex of one object and a face of the other object. Therefore, to identify all of the vertex-to-face distances that may potentially be the shortest distance, a two-pronged approach is taken. First, a respective distance between each vertex of the first object and each point, on every face of the second object, that is closest to that vertex, is calculated. Next, a respective distance between each vertex of the second object and each point, on every face of the first object, that is closest to that vertex, is calculated.

An edge-to-edge analysis considers that the shortest distance between the two objects may lie between a point on an edge of the first object and point on an edge of the second object. Therefore, to identify all of the edge-to-edge distances that may potentially be the shortest distance, a respective distance between points along each edge of the first object and each point, along each edge of the second object, that is closest to those points is calculated.

For each pair of points for all of the vertices, edges and faces of both the first and the second objects identified as described above, a calculation is performed to determine the distance between that pair of points. Then, all of the performed calculations are compared to determine which distance and corresponding pair of points comprises the shortest distance between the first object and the second object. This shortest distance is then returned as the final output.

However, existing approaches suffer from several drawbacks. For instance, as mentioned, the calculations described above are performed for numerous distances between vertices, edges, and faces for every single face of each of the first and the second object, regardless of the likelihood of those distances comprising the shortest distance between the two objects. While meshes representing simple objects may contain a relatively small number of faces (e.g., a mesh representing a simple box may contain only 12 faces), meshes representing complex objects may contain a large number of faces (e.g., a mesh representing a pipe may contain over 2,700 faces; a mesh representing an I-beam may contain over 3,000 faces, and a mesh representing a chair armrest may contain over 4,500 faces). Using existing techniques, the bare minimum number of calculations required in order to determine the shortest distance between a single pair of faces (e.g., one face from a first object and one face from a second object) is 15, as explained below.

Calculations required for a single pair of faces=15

Vertex to Face: 2*((#Faces Object $A$)*(#Faces Object $B$*3))=6

Edge to Edge: (#Faces Object $A$)*(#Faces Object $B$*9)=9

Most meshes have a large number of faces, especially meshes representing objects in a construction environment, such as pipes, ducts, fixtures, furniture, etc. As a result, the number of calculations required to determine a shortest distance between a given pair of objects can be in the millions and even hundreds of millions. Completing these calculations can be time-consuming and take several minutes, resulting in a less than ideal user experience.

To address these problems (among others), disclosed herein are optimization techniques for calculating the shortest distance between two objects in a more effective way. At a high level, the techniques disclosed herein improve upon the existing approach for calculating the shortest distance between two objects by (i) reducing the total number of faces for which pairs of points need to be identified and corresponding distances need to be calculated and (ii) reducing the total number of distances that need to be calculated. In one aspect, disclosed herein is a software tool that implements a first "reduced-faces" optimization technique that involves identifying, from all of the faces of each object in an object pair, those faces of each object that are visible to and pointing toward the other object, thereby eliminating the need to perform distance calculations for vertices, edges, and faces of each object that are obscured from the other object's view (referred to herein as the "Rendered Pixel Method"). In another aspect, disclosed herein is a software tool that implements a second "reduced-faces" optimization technique that involves identifying, from all of the faces of each object in an object pair, those faces of each object that are pointing toward the other object, thereby eliminating the need to perform distance calculations for vertices, edges, and faces of each object that are pointing away from the other object (referred to herein as the "Face Normal Method"). In yet another aspect, disclosed herein is a software tool that implements a "reduced-distances" optimization technique that reduces the number of distances calculated by analyzing only unique edges (referred to herein as the "Unique Edges Optimization"). Also disclosed herein is a software tool that facilitates calculation of the shortest distance between two objects in a three-dimensional BIM view using the disclosed optimization techniques.

Accordingly, in one aspect, disclosed herein is a computer-implemented method that involves (i) rendering, via a graphical user interface (GUI) displayed by a client station, a three-dimensional view of a construction project using a three-dimensional model file that defines a set of meshes representing physical objects of the construction project, wherein each mesh comprises a set of triangular faces, and wherein the GUI includes an indication of a measurement tool for obtaining a shortest distance between a first mesh and a second mesh; (ii) based on user input selections received via the measurement tool, receiving a request to obtain the shortest distance between the first mesh and the second mesh, wherein the request includes respective indications of the first mesh and the second mesh; (iii) calculating a set of distances potentially comprising the shortest distance between the first mesh and the second mesh by first reducing one or both of: (i) the number of faces between which distances are calculated and (ii) the number of distances that are calculated; and (iv) determining the shortest distance between the first mesh and the second mesh.

In another aspect, disclosed herein is a computing system that comprises at least one processor, a non-transitory computer-readable medium, and program instructions stored on the non-transitory computer-readable medium that are executable by the at least one processor to cause the computing system to carry out the operations disclosed herein, including but not limited to the operations of the foregoing methods.

In yet another aspect, disclosed herein is a non-transitory computer-readable medium comprising program instructions that are executable to cause a computing system to carry out the operations disclosed herein, including but not limited to the operations of the foregoing methods.

One of ordinary skill in the art will appreciate these as well as numerous other aspects in reading the following disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2 depicts an example computing device that may be configured to carry out one or more of the functions of the present disclosure.

FIG. 3 depicts an example GUI view that may be presented to a user for facilitating calculation of a shortest distance between two objects according to the disclosed system and techniques.

FIG. 6A depicts a diagram illustrating an example view frustum.

FIG. 6B depicts another example GUI view that may be presented to a user for facilitating calculation of a shortest distance between two objects according to the disclosed system and techniques.

FIG. 6C depicts an example rendered three-dimensional mesh of an object selected from the GUI view of FIG. 6B.

FIG. 6D depicts example image data corresponding to the meshes of objects selected from the GUI view of FIG. 6B.

FIG. 7A depicts a diagram illustrating example face normal vectors and corresponding faces of an example mesh.

FIG. 7B depicts example three-dimensional meshes comprising faces and face normal vectors that may be rendered in accordance with the disclosed system and techniques.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. Example System Configuration

The present disclosure is generally directed to software technology for managing construction projects, and in particular to a computing system and methods for optimizing calculation of the shortest distance between two objects depicted in a rendered three-dimensional view. As one possible implementation, this software technology may include both front-end software running on client stations that are accessible to individuals associated with construction projects (e.g., contractors, project managers, architects, engineers, designers, etc., each of which may be referred to generally herein as a "construction professional") and back-end software running on a back-end computing platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end computing platform. The software technology disclosed herein may take other forms as well.

In general, such front-end client software may enable one or more individuals responsible for a construction project to perform various tasks related to the management of the construction project, which may take various forms. According to some implementations, these tasks may include rendering three-dimensional views of the construction project, navigating through the various three-dimensional views of the construction project in order to select various objects between which to measure one or more distances, and obtaining measurements between the selected objects, as some non-limiting examples. Further, such front-end client software may take various forms, examples of which may include a native application (e.g., a mobile application) and/or a web application running on a client station, among other possibilities.

Figure 1:
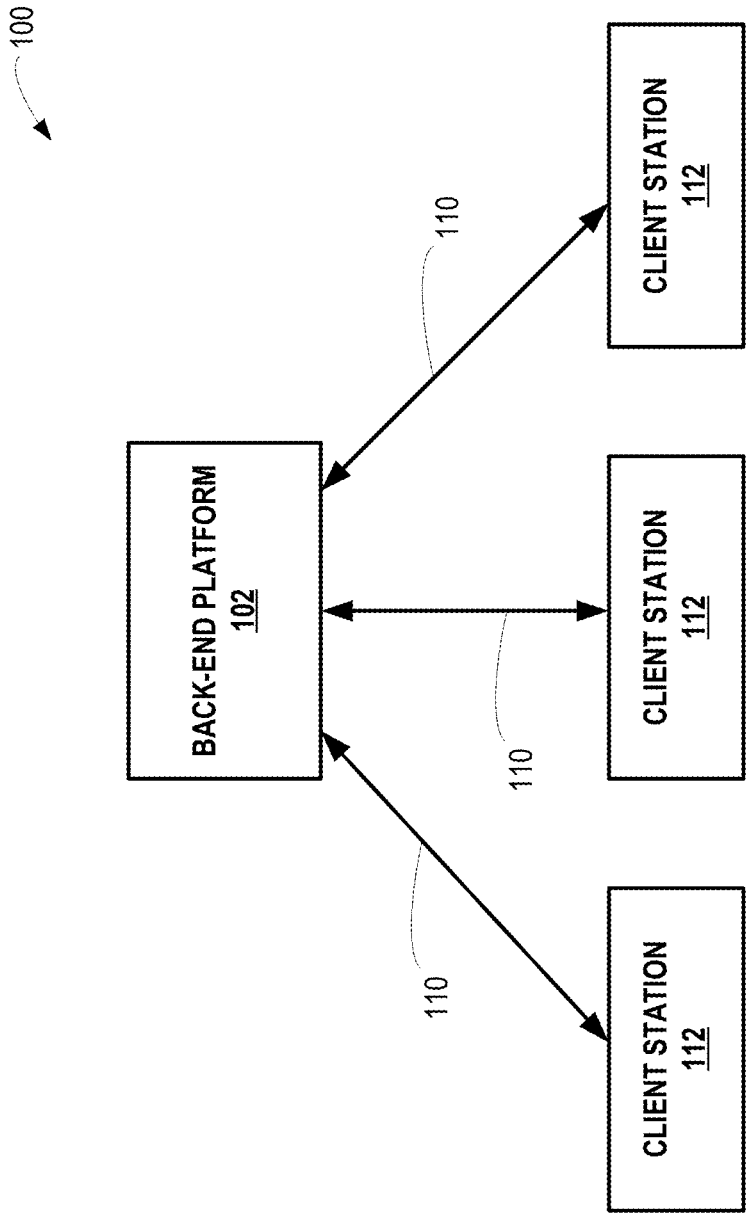
FIG. 1 depicts an example network configuration in which example embodiments may be implemented.

Turning now to the figures, FIG. 1 depicts an example network configuration 100 in which example embodiments of the present disclosure may be implemented. As shown in FIG. 1, network configuration 100 includes a back-end computing platform 102 that may be communicatively coupled to one or more client stations, depicted here, for the sake of discussion, as client stations 112.

Broadly speaking, back-end computing platform 102 may comprise one or more computing systems that have been provisioned with software for carrying out one or more of the functions disclosed herein, including but not limited to rendering three-dimensional views of models of a construction project, calculating distances between objects within the three-dimensional views, and/or transmitting data and/or instructions that cause one or more client stations 112 to output information related to a construction project, including the rendered three-dimensional views and distance information related to one or more objects in the rendered view. The one or more computing systems of back-end computing platform 102 may take various forms and be arranged in various manners.

For instance, as one possibility, back-end computing platform 102 may comprise computing infrastructure of a public, private, and/or hybrid cloud (e.g., computing and/or storage clusters) that has been provisioned with software for carrying out one or more of the functions disclosed herein. In this respect, the entity that owns and operates back-end computing platform 102 may either supply its own cloud infrastructure or may obtain the cloud infrastructure from a third-party provider of "on demand" computing resources, such as Amazon Web Services (AWS) or the like. As another possibility, back-end computing platform 102 may comprise one or more dedicated servers that have been provisioned with software for carrying out one or more of the functions disclosed herein. Other implementations of back-end computing platform 102 are possible as well.

In turn, client stations 112 may each be any computing device that is capable of running the front-end software disclosed herein. In this respect, client stations 112 may each include hardware components such as a processor, data storage, a user interface, and a network interface, among others, as well as software components that facilitate the client station's ability to run the front-end software disclosed herein (e.g., operating system software, web browser software, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end computing platform 102 is configured to interact with client stations 112 over respective communication paths 110. In this respect, each communication path 110 between back-end computing platform 102 and one of client stations 112 may generally comprise one or more communication networks and/or communications links, which may take any of various forms. For instance, each respective communication path 110 with back-end computing platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 with back-end computing platform 102 may be wireless, wired, or some combination thereof, and may carry data according to any of various different communication protocols. Although not shown, the respective communication paths 110 between client stations 112 and back-end computing platform 102 may also include one or more intermediate systems. For example, it is possible that back-end computing platform 102 may communicate with a given client station 112 via one or more intermediary systems, such as a host server (not shown). Many other configurations are also possible.

The interaction between client stations 112 and back-end computing platform 102 may take various forms. As one possibility, client stations 112 may send certain user input related to a construction project to back-end computing platform 102, which may in turn trigger back-end computing platform 102 to take one or more actions based on the user input. As another possibility, client stations 112 may send a request to back-end computing platform 102 for certain project-related data and/or a certain front-end software module, and client stations 112 may then receive project-related data (and perhaps related instructions) from back-end computing platform 102 in response to such a request. As yet another possibility, back-end computing platform 102 may be configured to "push" certain types of project-related data to client stations 112, such as rendered three-dimensional views, in which case client stations 112 may receive project-related data (and perhaps related instructions) from back-end computing platform 102 in this manner. As still another possibility, back-end computing platform 102 may be configured to make certain types of project-related data available via an API, a service, or the like, in which case client stations 112 may receive project-related data from back-end computing platform 102 by accessing such an API or subscribing to such a service. The interaction between client stations 112 and back-end computing platform 102 may take various other forms as well.

Although not shown in FIG. 1, back-end computing platform 102 may also be configured to receive data, such as data related to a construction project, from one or more external data sources, such as an external database and/or another back-end computing platform or platforms. Such data sources—and the data output by such data sources—may take various forms.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. Example Computing Device

FIG. 2 is a simplified block diagram illustrating some structural components that may be included in an example computing device 200, which could serve as, for instance, the back-end computing platform 102 and/or one or more of client stations 112 in FIG. 1. In line with the discussion above, computing device 200 may generally include at least a processor 202, data storage 204, and a communication interface 206, all of which may be communicatively linked by a communication link 208 that may take the form of a system bus or some other connection mechanism.

Processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that data storage 204 may comprise computer-readable storage mediums that are distributed across a plurality of physical computing devices connected via a network, such as a storage cluster of a public, private, or hybrid cloud.

As shown in FIG. 2, data storage 204 may be provisioned with software components that enable the computing device 200 to carry out the operations disclosed herein. These software components may generally take the form of program instructions that are executable by the processor 202 to carry out the disclosed functions, which may be arranged together into software applications, virtual machines, software development kits, toolsets, or the like, all of which are referred to herein as a software tool or software tools. Further, data storage 204 may be arranged to store project-related data in one or more databases, file systems, or the like. Data storage 204 may take other forms and/or store data in other manners as well.

Communication interface 206 may be configured to facilitate wireless and/or wired communication with configured other computing devices or systems, such as one or more client stations 112 when computing device 200 serves as back-end computing platform 102, or as back-end computing platform 102 when computing device 200 serves as one of client stations 112. As such, communication interface 206 may take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for wireless and/or wired communication. Communication interface 206 may also include multiple communication interfaces of different types. Other configurations are possible as well.

Although not shown, computing device 200 may additionally include one or more other interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with computing device 200.

It should be understood that computing device 200 is one example of a computing device that may be used with the embodiments described herein. Numerous other arrangements are possible and contemplated herein. For instance, other computing devices may include additional components not pictured and/or more or fewer of the pictured components.

III. Example Visual Representations of Construction Projects

As mentioned above, one aspect of managing a construction project involves the creation, review, and sometimes revision, of plans for the construction project. These plans assist construction professionals in carrying out the construction project. For example, some plans include written statements, such as a punch list or submittal log, which may communicate, for instance, what materials are needed during construction. Other plans may include visual representations of the construction project that visually communicate to the construction professionals how to assemble or construct the project.

Depending on the type of construction project, these visual representations tend to take one of two different forms. As one possibility, these visual representations may take the form of a set of two-dimensional technical drawings, such as architectural drawings, engineering schematics, or construction blueprints, among others. From these two-dimensional technical drawings, the construction professionals can determine how to construct the project. As another possibility, these visual representations may take the form of a computerized, three-dimensional visual representation of the construction project. Construction professionals can use a corresponding software tool to review the three-dimensional visual representation, often in conjunction with a review of two-dimensional technical drawings, as an aid during the construction process.

In order to facilitate the creation and use of a computerized, three-dimensional model of the construction project, a team of architects, designers, and/or engineers may engage in a process referred to as Building Information Modeling. As a general matter, Building Information Modeling refers to the process of designing and maintaining a computerized representation of physical and functional characteristics of a construction project, such as a building. Specialized software tools can then access this computerized representation and process it to visually communicate how to construct the building via a navigable, three-dimensional model of the building and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of the building, including walls, floors, and ceilings, as well as the building's infrastructure, including pipes, ducts, conduits, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as a "BIM viewer." A BIM viewer is software that accesses the information contained within a BIM file or a combination of BIM files for a particular construction project and then, based on that file or those files, is configured to cause a computing device to render a three-dimensional view of the computerized representation of the construction project. This view is referred to herein as a "three-dimensional BIM view" or simply a "three-dimensional view."

In order for BIM viewer software to be able to cause a computing device to render a three-dimensional view of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for this building may contain data describing how wide, how long, how high, and where, in relation to the other individual physical elements of the construction project, the duct is positioned.

There are many ways for BIM files to arrange and store data that describes the attributes of the individual physical elements of a construction project. As one example, BIM files may contain data that represents each individual physical component in the construction project (e.g., an air duct, a pipe, etc.) as geometric triangles such that when the geometric triangles are visually stitched together by BIM viewer software, the triangles form a mesh, which represents a scaled model of the physical component (e.g., the air duct, the pipe, etc.). As mentioned above, a given mesh is a collection of vertices, edges, and faces. A point is a position in three-dimensional space that can be represented by a set of x-, y-, z-coordinates. A vertex is a point that is joined by two edges to form an angle; an edge is a line segment that joins two points; and a face is a triangle formed by three vertices connected by three edges. As mentioned above, a given mesh may be comprised of thousands, tens of thousands, or even hundreds of thousands of individual faces, where each face may have a respective set of three vertices and three edges and corresponding sets of x-, y-, z-coordinates for each vertex and each edge that form the face.

Generally, a BIM file will define the three-dimensional space—in which the scale model of the construction project is represented—by a set of x-, y-, and z-axes. Although other arrangements are possible, typically a BIM file will define (i) a z-axis as running vertically, (ii) a y-axis as being perpendicular to the z-axis and running along a lateral direction, such as North-South or East-West, and (iii) an x-axis as being perpendicular to both the z-axis and the y-axis and running along the other of the lateral directions, such as North-South or East-West, as examples. Thus, each x, −y, and z-coordinate of the points of the meshes defined by the BIM file lies in the three-dimensional space defined by these x-, y-, and z-axes. Further, these three axes will define at least two relevant planes: an x-y plane and a z-plane.

In this respect, the BIM file may contain data that represents each face of a given mesh as a set of coordinates in three-dimensional space. For instance, for each face stored in the BIM file, the BIM file may contain data describing the coordinates of (i) each vertex of the face (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle), (ii) each point along each edge of the face, and (iii) each point on the face itself. A given mesh may be comprised of thousands, tens of thousands, or even hundreds of thousands of individual faces, where each face may have corresponding sets of three-dimensional space coordinates for each vertex, edge, and point comprising the face. However, other ways for a BIM file to contain data that represents each individual physical component in a construction project are possible as well.

In addition to data describing the individual vertices, edges, and faces of a mesh, some BIM files may contain additional data that helps to summarize information relating to the various meshes. As one example, a BIM file may contain, for each mesh, data describing a "bounding box." Conceptually, a bounding box is an imaginary box surrounding the mesh on all sides, with the edges of this box being located at the outermost edges of the mesh. As such, the entire mesh fits inside of this bounding box with no part of the mesh protruding from the bounding box. In this way, the bounding box represents the maximum dimensions of the mesh in rectangular form. BIM viewer software may utilize bounding boxes stored in BIM files in various ways. For instance, it usually takes less storage space to store data describing a bounding box compared to data describing an entire mesh. This is due to the fact that a mesh may comprise of many thousands of triangles in order to accurately represent the mesh's surface, which in some cases is irregular (e.g., the curved surface of a pipe), whereas a bounding box can typically be represented by data describing just eight vertices of a rectangular box. Some BIM viewer software may be configured to operate in a mode designed to conserve processing power and/or storage space in which the BIM viewer software causes a computing device to render just bounding boxes as opposed to rendering the full meshes. By doing so, the BIM viewer software can visually communicate a "low resolution" version of the construction project. Other ways of utilizing bounding boxes, and other ways of containing additional data to help summarize information relating to the various meshes, are possible as well.

As another example, a BIM file may contain, for each individual face represented in a mesh, a "face normal." A "normal" of a surface is a vector, perpendicular from the surface, that represents the orientation of the surface. A "face normal" is a vector that represents the orientation of a face (e.g., which way the face is pointing). Such information may be useful when determining the visibility of a given element from different perspectives within the three-dimensional view.

As a general matter, a perspective from which the BIM viewer renders a three-dimensional BIM view generally has four components: (1) an X-component, which reflects the position of the perspective along a lateral x-axis of the scaled model; (2) a Y-component, which reflects the position of the perspective along a lateral y-axis of the scaled model (where the lateral y-axis is perpendicular to the lateral x-axis); (3) a Z-component, which reflects the position of the perspective along a vertical z-axis of the scaled model (where the vertical z-axis is perpendicular to both the lateral x-axis and the lateral y-axis); and (4) an orientation, which reflects the direction of the perspective (where the "orientation" component is sometimes connotatively referred to as a "camera angle.").

The orientation component of the perspective can be broken down into two subcomponents: (i) a lateral angle, which reflects the direction of the perspective within a lateral plane; and (ii) a vertical angle, which reflects the direction of the perspective within a vertical plane. For example, an orientation with a lateral angle of 0° may look straight "North;" an orientation with a lateral angle of 90° may look straight "East;" an orientation with a lateral angle of 180° may look straight "South;" and an orientation with a lateral angle of 270° may look straight "West," although any angle from 0° to 360° is possible. Moreover, an orientation with a vertical angle of 0° may look straight up, an orientation with a lateral angle of 90° may look straight level with the ground, and an orientation with a lateral angle of 180° may look straight down, although any angle from 0° to 180° is possible. Although the cardinal directions "North," "East," "South," and "West" are used here to help conceptualize the lateral plane, it should be understood that in practice, an orientation with a lateral angle of 0° may not necessarily reflect a view that looks into the Cardinal direction North.

BIM files may contain additional data as well, including data describing other attributes of the individual physical elements of the construction project that may or may not be related to the element's specific position in three-dimensional space. By way of example, this data may include data describing what system or sub-system the component is associated with (e.g., structural, plumbing, HVAC, electrical, etc.), data describing what material or materials the individual physical element is made of, what manufacturer the element comes from, what stage of manufacture the element is in, where the element currently resides (e.g., data indicating that the element is on a truck for delivery to the construction site, and/or once delivered, data indicating where at the construction site the delivered element resides), and/or various identification numbers assigned to the element (e.g., a serial number, part number, model number, tracking number, etc.), as well as others.

Together, these other attributes are generally referred to as metadata. BIM viewer software may utilize this metadata in various ways. For instance, some BIM viewer software may be configured to present different views based on metadata (e.g., displaying all meshes that represent HVAC components but hiding all meshes that represent plumbing components; and/or displaying meshes representing metal components in a certain color and displaying meshes representing wood components in another color, etc.). Alternatively, or additionally, BIM viewers can display certain subsets of the metadata based on user input. For example, a user may provide a user input to the BIM viewer software though a click or tap on a GUI portion displaying a given mesh, and in response, the BIM viewer software may cause a GUI to display some or all of the attributes of the physical element represented by the given mesh. Other examples are possible as well.

As mentioned, BIM viewer software is generally deployed on client stations, such as client stations 112 of FIG. 1 (which, as described above, can generally take the form of a desktop computer, a laptop, a tablet, or the like). As such, construction professionals can utilize BIM viewer software during all phases of the construction project and can access a BIM file for a particular construction project in an office setting as well as on the construction site. Accordingly, BIM viewer software assists construction professionals with, among other things, the design and construction of the project and/or to identify issues that may arise during such construction.

As noted, BIM viewer software operates to render a three-dimensional BIM view such that it presents a three-dimensional view of a construction project from a particular perspective. To illustrate one example of a rendered three-dimensional BIM view, FIG. 3 depicts an example view 300 of a GUI, which includes a three-dimensional view of a construction project rendered at a particular perspective. View 300 may be generated by, for instance, a software tool running on a client station, such as one of client stations 112 (FIG. 1), accessing a BIM file, and then rendering a three-dimensional view of the construction project based on that BIM file and presenting it via a display interface of that client station. Alternatively, a computing platform, such as back-end computing platform 102 (FIG. 1) may access a BIM file and may generate a set of instructions for rendering a three-dimensional view of the construction project based on that BIM file. Back-end computing platform 102 may then send these instructions to one of client stations 112, which in turn may present a three-dimensional view of the construction project via a display interface of that client station based on these instructions. Still other arrangements are possible.

As depicted, view 300 includes a three-dimensional view of a construction project from a particular perspective. The three-dimensional view depicted in FIG. 3 includes a number of meshes that represent individual physical components of the construction project, such as floors, walls, pipes, ducts, etc. In particular, depicted in FIG. 3 is, among others, a mesh 304, which represents a desk cabinet, a mesh 306, which represents a wall cabinet, and a mesh 308, which represents a chair. Of course, in other examples, other meshes are possible as are other layouts and designs of construction projects.

A client station presenting view 300 may be configured to adjust the perspective at which the three-dimensional view is presented in response to, for instance, receiving user inputs at the client station to navigate the three-dimensional view. To facilitate such navigation, the BIM viewer tool may generate a GUI view that presents the three-dimensional BIM view as well as one or more navigational controls overlaid on the three-dimensional BIM view. The BIM viewer tool may be configured to receive a user input at the navigational controls (e.g., a touch, or a touch combined with a drag), and, based on a respective user input, change the position of the perspective from which the BIM viewer tool renders the three-dimensional BIM view. The BIM viewer tool may also be configured to receive user input requesting a shortest distance between two elements within the view, thereby initiating one or more of the optimization techniques disclosed herein. The BIM viewer tool may be configured to receive such user inputs via a GUI menu, such as the menu 302 shown in view 300. As shown, the menu 302 may present various options that may be selected by a user to input a request to initiate various operations, such as navigating the three-dimensional view, or obtaining measurements between objects, among other possibilities. Such options may be selectable by the user via a user input, such as a mouse or touchpad input, a keyboard input, and/or a touch screen input. Upon receiving an indication of the user request to initiate an operation based on the selected GUI menu option, the client station may send a request to the computing platform to initiate the operation, as discussed in more detail below.

IV. Example Operations

To illustrate the features and functionality of the disclosed technology on a more detailed level (but still by way of example), set forth below is a description that makes reference to FIGS. 4A-7B.

FIGS. 4A-4C, 6A-6D, and 7A-7B generally depict screenshots from operational states of one or more embodiments of a BIM viewer tool, such as software technology developed by Procore Technologies, Inc.

Figure 5:
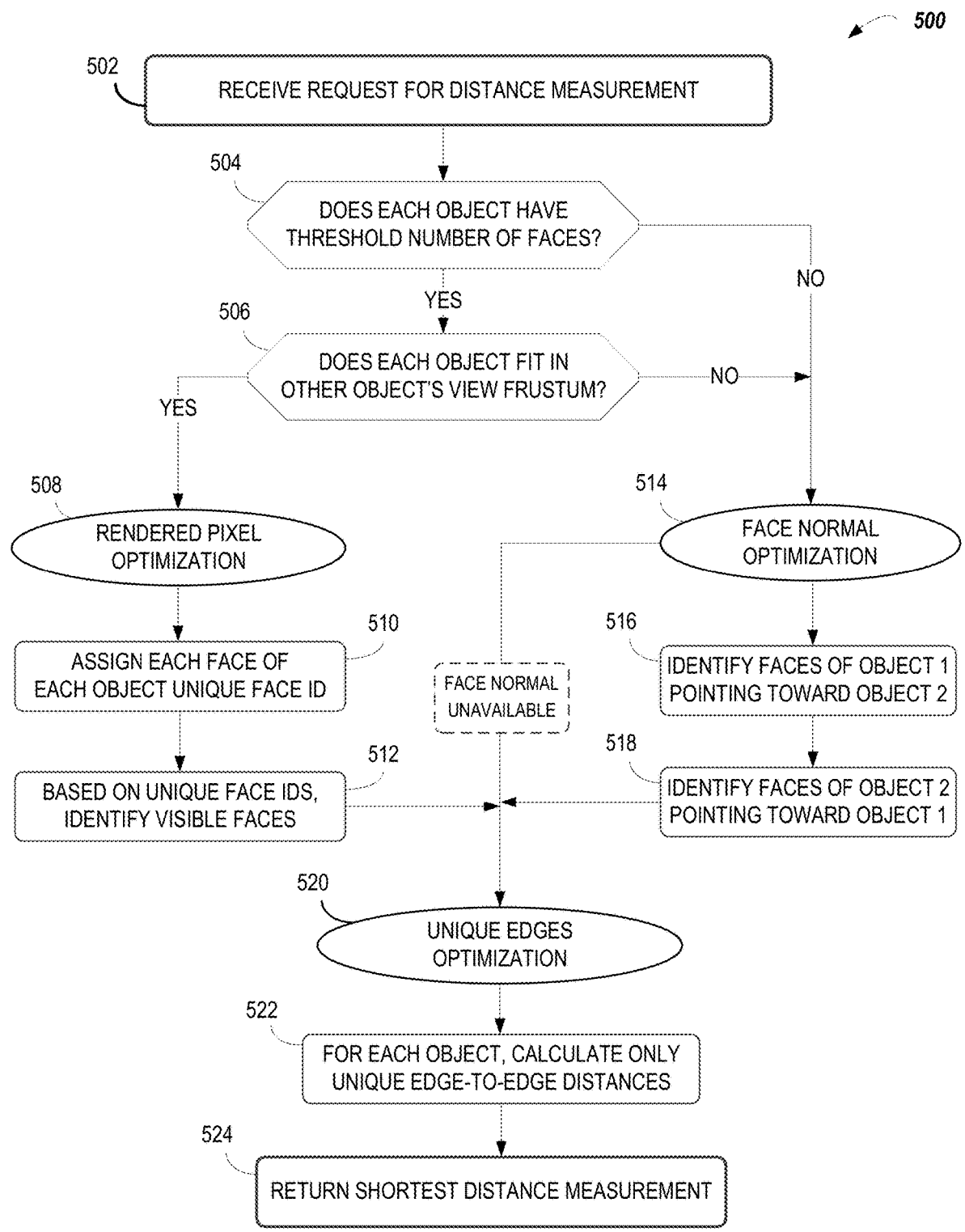
FIG. 5 depicts an example process for calculating the shortest distance between two objects according to the disclosed techniques.

FIG. 5 illustrates a flow diagram 500 that depicts operations that may be performed by a computing device in accordance with the software technology disclosed herein. It should be understood that each block in flow diagram 500 may represent a module or portion of program code that includes instructions that are executable by a processor to implement specific logical functions or steps in a process. The program code may be stored on any type of computer-readable medium, such as non-transitory computer readable media (e.g., data storage 204 shown in FIG. 2). In other cases, a block in a flow diagram may represent circuitry that is wired to perform specific logical functions or steps in a process. Moreover, the blocks shown in the flow diagrams may be rearranged into different orders, combined into fewer blocks, separated into additional blocks, and/or removed, based upon the particular embodiment. The flow diagram 500 may also be modified to include additional blocks that represent other functionality that is described expressly or implicitly elsewhere herein.

Further, as a general matter, when reference is made herein to a "computing platform" engaging in one or more operations, it should be understood that such operations may, in practice, be carried out by one or more computing devices executing one or more instances of the disclosed software tool(s). In particular, it should be understood that such example operations may be carried out by a computing device, such as computing device 200 (FIG. 2), which as described above, may serve as one or more of client stations 112 (FIG. 1) and/or back-end computing platform 102 (FIG. 1). In this respect, it should be further understood that, depending on the implementation, the operations discussed herein below may be carried out entirely by a single computing device, such as one or more of client stations 112 or by back-end computing platform 102, or may be carried out by a combination of computing devices, with some operations being carried out by back-end computing platform 102 (such as computational processes and data-access operations) and other operations being carried out by one or more of client stations 112 (such as display operations and operations that receive user inputs). However, other arrangements are possible as well.

In practice, the process of calculating the shortest distance between two objects in a three-dimensional view according to the disclosed optimization techniques may be initiated while a user is accessing a BIM viewer tool. As described above, the user may access a BIM viewer tool via a software application that may take the form of either (i) a software as a service ("SaaS") application that comprises a front-end software component running on the user's client station and a back-end software component running on a back-end computing platform that is accessible to the user's client station via a communication network or (ii) a native application that runs on the user's client station, among other possibilities.

According to one example embodiment in which the user is accessing a BIM viewer tool via a SaaS application, the user may begin by inputting a request into the user's client station to access the SaaS application that incorporates the BIM viewer tool (such as the one offered by Procore Technologies, Inc.). In response to receiving the user's request, the back-end computing platform may cause the user's client station to present a GUI view displaying a rendered three-dimensional BIM view as well as one or more controls overlaid on the three-dimensional BIM view.

In an embodiment where the BIM viewer tool runs on a SaaS, a back-end computing platform, such as back-end computing platform 102 (FIG. 1) may access a BIM file and may generate a set of instructions for rendering a three-dimensional view of the construction project based on that BIM file. Back-end computing platform 102 may then send these instructions to one of client stations 112, which in turn may present a three-dimensional view of the construction project via a display interface of that client station based on these instructions. Alternatively, in an embodiment where the BIM viewer software runs natively on a user's client station, the GUI view may be generated by, for instance, the BIM viewer tool running on the user's client station, such as one of client stations 112 (FIG. 1), accessing a BIM file, and then rendering a three-dimensional view of the construction project based on that BIM file and presenting it via a display interface of that client station. Still other arrangements are possible.

Figure 4A:
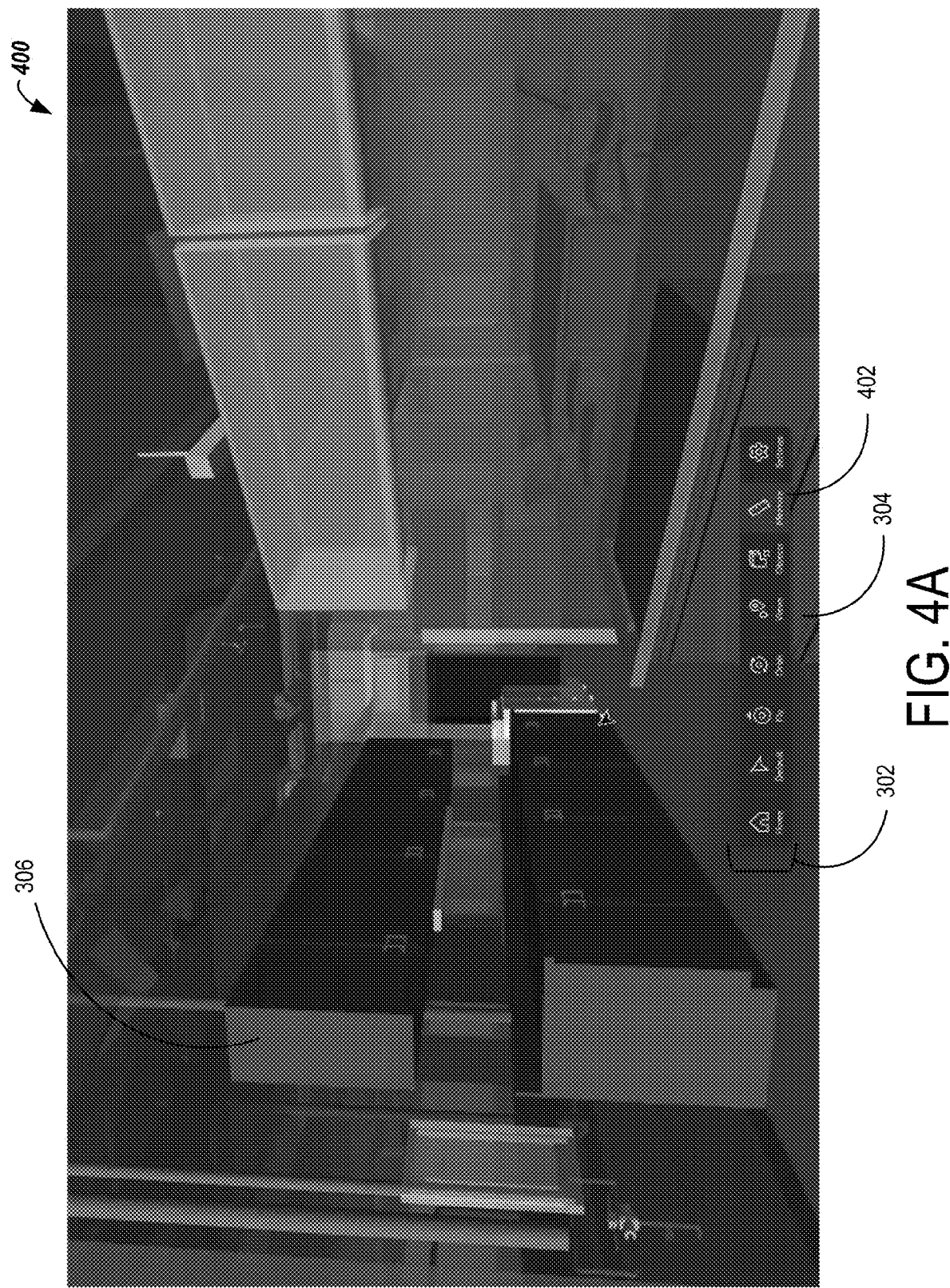
FIG. 4A depicts a first example modified GUI view that may be presented to a user for facilitating calculation of a shortest distance between two objects according to the disclosed system and techniques.

To illustrate, FIG. 4A depicts a GUI view 400, which shows a three-dimensional BIM view of a construction project rendered at a particular perspective. In particular, view 400 presents a modified view of the view 300 shown in FIG. 3 from a different perspective (e.g., zoomed in).

As shown in FIG. 4A, view 400 may include a number of meshes that represent individual physical components of the construction project, including the meshes 304 and 306 from view 300. View 400 may also include the GUI menu 302 of FIG. 3. As described above, the GUI menu 302 may include various tools that may be selected by a user to access various features and initiate various operations. Such tools may be represented by a visual representation such as a textual label, an icon, and/or a GUI button. For example, one such tool available for selection in the GUI menu 302 may be a tool for measuring distances between objects in the three-dimensional view.

As shown in view 400, the GUI menu 302 may feature a "Measure" tool 402, which may be selected by a construction professional via a user input as described above (e.g., mouse or trackpad input, keyboard input, and/or touch screen input, etc.). By selecting the "Measure" tool 402, the user may input a user request to initiate the process of calculating a measurement for the shortest distance between two elements (also referred to herein as "the measuring process") in the view 400. Upon receiving an indication of the user request to initiate the measuring process, the client station may update the GUI view to present an indication that the measuring process has been initiated. Such an indication may include a visual indication. The visual indication may include, for example, highlighting, in the GUI menu, the visual representation of the tool for initiating the measuring process. Additionally, or alternatively, the visual indication may include a textual indication that the measuring process has been initiated, such as a textual label or a pop-up message. Other examples are also possible. As shown in view 400 of FIG. 4A, the visual indication may include highlighting the "Measure" tool 402 in the GUI menu 302.

After inputting a request to initiate the measuring process, the user may proceed to select two elements (i.e., objects) for which to obtain a shortest distance measurement. After selecting a first object, the user may be presented with a modified GUI view indicating that a first object has been selected. Such an indication may include a visual indication, such as highlighting the first object and/or presenting a textual label indicating that the first object has been selected. The user may then proceed to select a second object. Upon receiving an indication that the user has selected the second object, the client station may, in one embodiment, send a request to the back-end computing platform to calculate the shortest distance. In turn, after receiving the request to calculate the shortest distance, the back-end computing platform may proceed to calculate the shortest distance between the first and the second objects using the disclosed optimization techniques, which will be described in more detail further below with respect to FIGS. 5-7B. As mentioned above, however, in some embodiments, certain functionality may be carried out by a user's client station running a native application. Thus, in another embodiment, upon receiving an indication that the user has selected the second object, the client station may proceed to calculate the shortest distance between the first and the second objects using the disclosed optimization techniques, which, as noted, will be described in more detail further below with respect to FIGS. 5-7B After selecting the second object, the user may be presented with a modified GUI view including (i) a visual indication of the second object that was selected, (ii) a measurement representing the shortest distance between the first object and the second object, and (iii) a visual indication of the path of the shortest distance between a first point on the first object and a second point on the second object. Additionally, depending on the position of the two objects relative to one another, the view may also include (iv) a measurement representing a lateral distance (e.g., co-planar with the x-y plane) between the first object and the second object and (v) a measurement representing a vertical distance (e.g., co-planar with the z-plane) between the first object and the second object.

To illustrate one example of this, while being presented with the view 400 of FIG. 4A, the construction professional may wish to obtain a measurement between a desk cabinet represented by mesh 304 and a wall cabinet represented by mesh 306. Therefore, the construction professional may select from the GUI menu 302 the "Measure" tool 402 to initiate the measuring process. After selecting the "Measure" tool 402, the construction professional may proceed to select, as a first object, the desk cabinet represented by mesh 304.

Figure 4B:
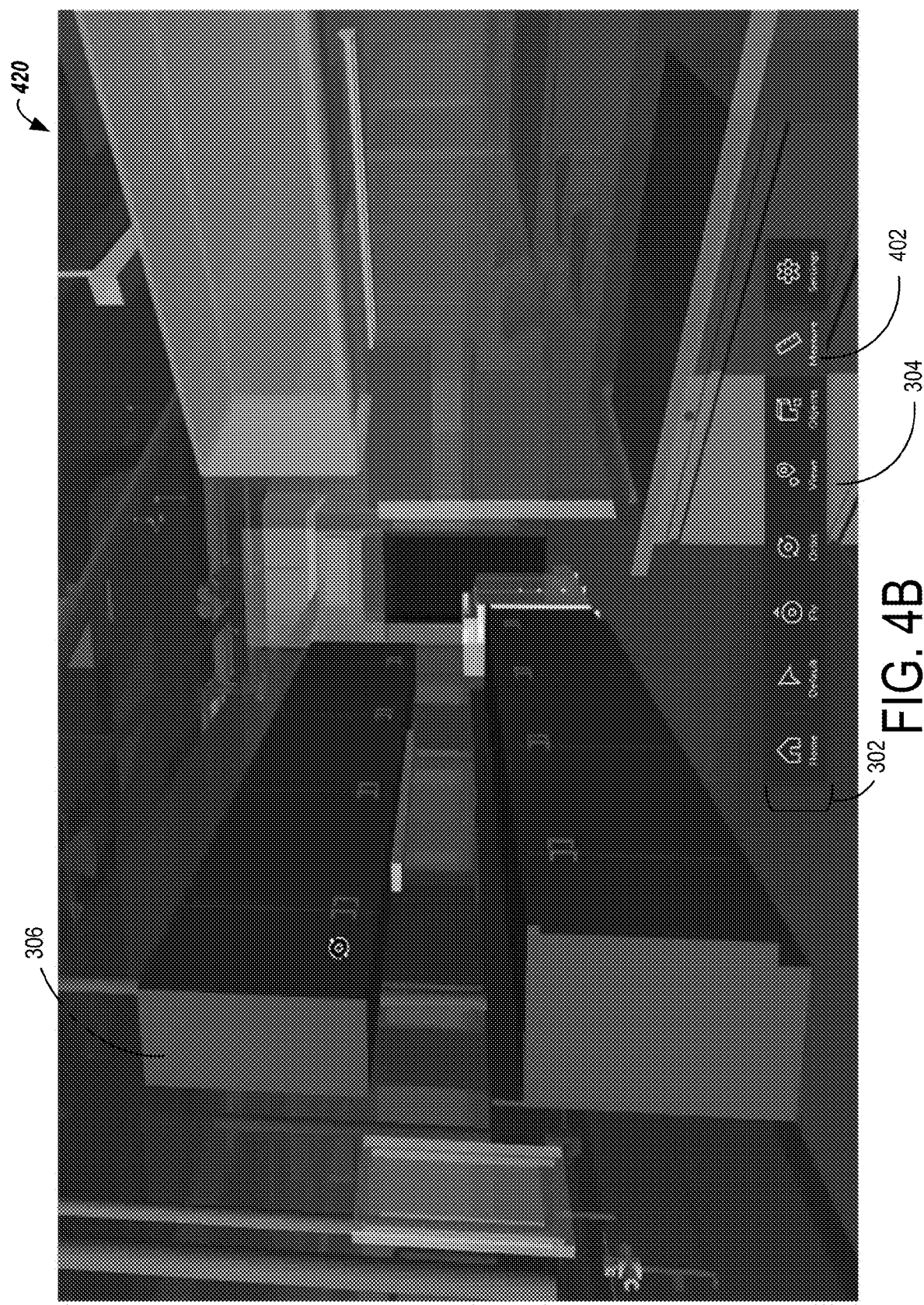
FIG. 4B depicts a second example modified GUI view that may be presented to a user for facilitating calculation of a shortest distance between two objects according to the disclosed system and techniques.

After selecting the mesh 304, the user may be presented with a modified view 420 depicted in FIG. 4B. View 420 may include a visual indication that the construction professional has selected the mesh 304 as the first object. As shown in view 420, such a visual indication may include highlighting the mesh 304 in a unique color. The construction professional may then proceed to select, as a second object, the wall cabinet represented by the mesh 306.

Upon receiving an indication of the construction professional's selection of the second object, the client station may transmit a request to the computing platform to calculate the shortest distance between the two objects selected by the construction professional. In turn, the computing platform may proceed to calculate the shortest distance between the desk cabinet and the wall cabinet depicted in FIG. 4B using the disclosed optimization techniques, as will be described in further detail below with respect to FIGS. 5-7B. After calculating the shortest distance using the disclosed optimization techniques, the computing platform may cause the client station to present the construction professional with a modified GUI view, such as the view 440 of FIG. 4C, that includes the measurement representing the shortest distance.

Figure 4C:
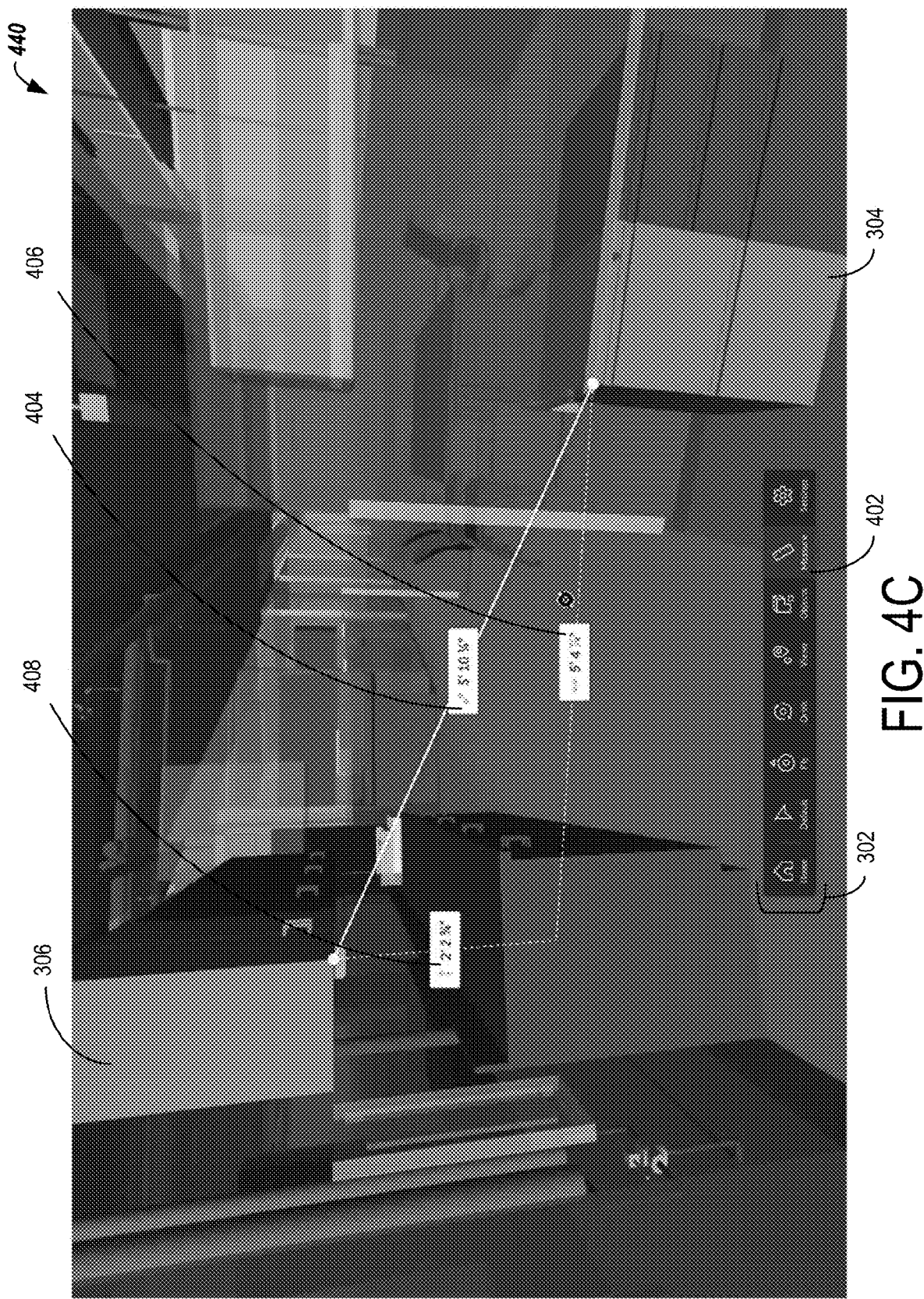
FIG. 4C depicts a third example modified GUI view that may be presented to a user for facilitating calculation of a shortest distance between two objects according to the disclosed system and techniques.

As shown in FIG. 4C, the view 440 may include a measurement representing the shortest distance between the two objects selected by the construction professional. The measurement may take the form of a numeric or alphanumeric textual label, such as the label 404. Further, the view 440 may include a visual indicator representing the respective point on each of the two objects that comprise the path of the shortest distance. Such a visual indicator may take the form of a line connecting two points on the mesh 304 and the mesh 306 that traces the shortest distance between the desk cabinet and the wall cabinet, respectively. If the path comprising the shortest distance is not co-planar with any of an x-y plane or the z-plane (which are defined by the three x-, y-, and z-axes), then the computing platform may also calculate, and cause the client station to display in the GUI view, measurements representing (i) a lateral distance between the two objects and (ii) a vertical distance between the two objects. In some implementations, the client station may be configured to derive a lateral and/or a vertical distance based on the distance returned by the computing platform.

As shown in view 440, the shortest distance 404 between mesh 304 and mesh 306 is a hypotenuse, which is not co-planar with any of the x-y plane or the z-plane. Therefore, in this embodiment, the view 440 further includes a measurement representing the lateral distance (e.g., co-planar with the x-y plane), and a measurement representing the vertical distance (e.g., co-planar with the z-plane), between the two objects represented by mesh 304 and mesh 306. The measurements representing the lateral distance and the vertical distance may take the form of numeric or alphanumeric textual labels, such as the labels 406 and 408, respectively. Additionally, the view 440 may include a visual indication of the second object that was selected, which may take the form of highlighting the mesh 306 in the same unique color as the highlighted mesh 304.

After requesting a shortest distance calculation for a first pair of objects in the three-dimensional view, the user may proceed to repeat the measuring process for a different pair of objects.

V. Shortest Distance Optimization Techniques

As noted above, upon receiving a request to calculate a shortest distance measurement between two objects, the computing platform may carry out a process to determine which of the disclosed techniques to apply in order to optimize calculation of the shortest distance between the two objects. As discussed above, the disclosed techniques provide three levels of optimizations to the existing approaches, and the process to determine which of the disclosed techniques to apply seeks to apply the highest level of optimization that is possible. Each of these techniques will now be described in more detail with respect to FIGS. 5-7B.

FIG. 5 depicts an example process 500 that the computing platform may carry out in order to determine which of the disclosed techniques (e.g., which level of optimization) to implement.

At block 502, the computing platform may receive a request from the client station to calculate the shortest distance between a first object, represented by a first mesh, and a second object, represented by a second mesh. The request may include an indication of the first object (e.g., the mesh representing the first object) and the second object (e.g., the mesh representing the second object).

a. Reduced-Faces Optimization Techniques

After receiving the request to calculate the shortest distance, the computing platform may proceed to apply one or more of the disclosed optimization techniques to calculate the shortest distance between the two objects selected by the user. The computing platform may begin by attempting to apply one of the two disclosed reduced-faces optimization techniques as mentioned above. The computing platform may first attempt to apply the Rendered Pixel Method optimization technique, which provides the highest level of optimization by reducing the largest amount of faces for which distances need to be calculated.

The Rendered Pixel Method ("RPM") reduces the total number of faces for which distances need to be calculated by eliminating, from the set of faces for which distances are calculated, those faces of each of the two objects that are obscured from the view of the other object. The RPM achieves this reduction by identifying, for each of the two objects, the faces that are visible to (e.g., pointing toward and unobscured from view of) the other object, and calculating distances with respect to only those identified faces.

At a high level, the Rendered Pixel Method involves analyzing pixels to identify faces of each object that are visible to the other object, and then performing the required distance calculations on only those faces that are visible to the other object in order to determine a shortest distance between the two objects. In this way, the RPM optimizes existing approaches for calculating a shortest distance by eliminating the need to perform calculations for those faces of an object that are obscured from the other object's view.

According to one embodiment of the RPM, two initial conditions must be met in order to implement the RPM: (1) each object must have at least a threshold number of faces (e.g., 1,000 faces), and (2) each object must fit within the other object's view frustum (i.e., each object's field of view). The first condition helps to ensure that the objects are complex, as the RPM may not be as useful when applied to relatively less-complex objects. The second condition helps to ensure that each object is completely in view of the other object, as the RPM may be more useful when each object is fully visible to the other object.

At block 504, the computing platform may determine if the first condition of the RPM is met: that is, if each of the two objects has at least the threshold number (e.g., 1,000) of faces. To determine if each object has at least the threshold number of faces, the computing platform may access available information about each object (e.g., the object's respective mesh). For example, this information may be available in the BIM file from which the three-dimensional view was rendered. If the computing platform determines that each object has at least the threshold number of faces, the computing platform may next proceed to determine if the second condition of the RPM is met. In some embodiments, the condition of block 504 may not be required, and the computing platform may proceed instead from block 502 to block 506.

At block 506, the computing platform may determine if each object fits within the other object's view frustum. A view frustum of a given object refers to a region of three-dimensional space that contains everything that is potentially visible from a particular viewing perspective of the given object when the given object acts as a camera. A given object's view frustum may be determined by treating the given object as a camera and using perspective projection to identify the camera's field of view (e.g., angle of view), aspect ratio, near plane, and far plane. This viewing perspective may be achieved, for example, by positioning a camera at the center of the given object (e.g., a first object), where the center of the given object may be obtained using a bounding box of the given object, and pointing the camera toward the center of another object (e.g., a second object). The area defined by the bounds of the field of view, the near plane, and the far plane of the camera is referred to herein as the camera's view frustum. A diagram of an example view frustum 610 is shown in FIG. 6A.

Determining whether or not a second object falls within the camera's view frustum can be done in various ways. One way to make this determination is to use a bounding box corresponding to the second object to determine if the second object fits within the camera's view frustum—if the bounding box (e.g., maximum dimensions of the other given object) fits within the frustum, then it can be assumed that the second object fits within the frustum. For example, after obtaining the first object's view frustum, the computing platform may access from the BIM file bounding box information for the second object to determine if the second object fits within the first object's view frustum. The computing platform may then repeat this process to determine if the first object is within the view frustum of the second object. If the computing platform determines that each object fits within the other object's view frustum, it may proceed to implement the disclosed Rendered Pixel Method optimization technique at block 508.

In some embodiments, the condition of block 506 may not be required, and the computing platform may proceed instead from block 502 or 504 to block 508. In other embodiments, the condition of block 506 may not be required for both the first and the second objects. For example, the computing platform may determine that the first object fits within the view frustum of the second object, and that the second object does not fit within the view frustum of the first object. In such instances, the computing platform may proceed to implement the RPM (as described below with respect to blocks 508-512 and FIGS. 6A-6D) for the first object in order to reduce the number of faces of the first object. The computing platform may then proceed to implement the Face Normal Method (as described below with respect to blocks 514-518 and FIGS. 7A-7B) for the second object in order to reduce the number of faces of the second object. In such embodiments, both the Rendered Pixel Method and the Face Normal Method may be implemented based on whether each object individually meets the conditions at blocks 504 and/or 506. In still other embodiments, neither of the conditions at blocks 504 and 506 may be required, and the computing platform may proceed to implement the RPM without determining whether the conditions are met.

In general, a given mesh may be represented as a solid color (e.g., each face of the given mesh may be represented in the same color) as seen in the three-dimensional view. However, to perform pixel analysis according to one embodiment of the RPM, the computing platform may need to uniquely identify faces of each object (e.g., the respective mesh representing each object). Therefore, in order to be able to uniquely identify faces of each object, at block 510, the computing platform may associate each face of the first object and each face of the second object with a respective unique face identifier. The unique face identifier may take various forms. As one example, the unique face identifier may take the form of an alphanumerical value. As another example the unique face identifier may take the form of a color value, such as an RGB value. According to one embodiment of the RPM, the computing platform may convert a first form of a unique face identifier to a second form of a unique face identifier in order to conduct the pixel analysis. In such an embodiment, the computing platform may convert unique face identifiers of a given mesh from unique alphanumerical values to unique RGB color values. For example, the computing platform may convert a first face identifier of the given mesh to an RGB value of (0,0,0), which corresponds to the color black. Each subsequent face identifier may be converted to an incremental RGB value representing various shades of a particular color. Depending on the number of faces, the RGB values may span multiple colors. In this way, each face of each object may be represented as a unique RGB value. Other forms of unique face identifiers are also possible.

At block 512, while rendering the three-dimensional view of the construction project, the computing platform may analyze the unique face identifiers of each face of each object to identify the faces of each object that are visible to the other object. For example, in an embodiment where the unique face identifiers take the form of unique RGB values, the computing platform may analyze the face identifiers by inspecting pixels in a framebuffer accessible to the computing platform. A framebuffer is a memory buffer that contains data which represents all of the pixels in a given frame of data that is sent to a screen for display. Such data may include, for example, image data and color data for each pixel of the image data. The framebuffer may be stored in a memory of a computing device, such as the computing platform 102 or one of the client stations 112.

While rendering the three-dimensional view, the computing platform may obtain image data and color data present in a given frame of data corresponding to the rendered three-dimensional view. For example, the computing platform may inspect the pixels of the image data in a first frame corresponding to the three-dimensional view of the second object as seen from the perspective of the first object (e.g., the first object acts as a camera). Then, the computing platform may inspect the pixels of the image data in a second frame corresponding to the three-dimensional view of the first object as seen from the perspective of the second object (e.g., the second object acts as the camera). For each frame, the computing platform may inspect pixels of the image data in the frame to identify the unique RGB values present in that frame. Because each RGB value is unique to a particular face, after determining which RGB values are present in the frame, the computing platform may then convert those RGB values back to their corresponding face identifiers. Using the face identifiers, the computing platform may then identify the particular faces of each object that are visible to the other object. The computing platform may then proceed to perform distance calculations on only the identified visible faces as described further below beginning at block 520. In this way, the computing platform may uniquely identify only those faces of each object that are visible to (e.g., facing toward and unobscured from view of) the camera and thereby eliminate the faces that, while may be present in the camera's view frustum, may be obscured from the camera's field of view by other faces of each object that are closer to the camera.

By eliminating, from the set of faces on which distance calculations will be performed, those faces of each object that are obscured from the view of the other object, the computing platform may reduce the total number of faces for which distance calculations are performed, resulting in decreased overall computing time and providing a significantly enhanced user experience.

To illustrate, FIG. 6B depicts an example GUI view 600 where a construction professional has selected two objects using the Measure tool 402 of FIGS. 4A-4C as described above. As shown in view 600, the construction professional may have selected a first armrest 602A and a second armrest 604A for which the construction professional desires a distance measurement. Based on the construction professional's input, the client station may send a request to the computing platform to calculate the shortest distance between the first armrest 602A and the second armrest 604A.

After receiving the request, the computing platform may begin the process described in FIG. 5 by determining if the initial RPM conditions are met. First, the computing platform may determine if each object contains at least the threshold number of faces. The computing platform may determine, based on, for example, information available in the BIM file from which view 600 is rendered, that the respective mesh corresponding to the first armrest 602A contains 4,487 faces. Additionally, the computing platform may determine that the respective mesh corresponding to the second armrest 604A contains 4,506 faces. Next, the computing platform may proceed to determine if each armrest fits within the other armrest's view frustum, as described above.

After determining that both conditions of the RPM are met, or in an embodiment where the initial conditions are not required, the computing platform may proceed to implement the RPM optimization technique as described above. The computing platform may associate each face of armrest 602A and armrest 604A with a unique face identifier. FIG. C depicts an example mesh 608 corresponding to the armrest 602A after each face has been associated with a unique RGB value. As can be seen, the faces of mesh 608 have been associated with unique RGB values, ranging from the RGB value (0,0,0), represented as the color black, to incremental RGB values representing various shades of the color red. After associating each face of armrests 602A and 604A with a unique RGB value, the computing platform may proceed to perform a pixel analysis based on framebuffer data as described above.

As shown in FIG. 6D, the computing platform may obtain image data and color data 602B, which depicts a frame of data, obtained from the framebuffer, corresponding to a view of armrest 602A as seen from the camera perspective of armrest 604A. As can be seen, image 602B includes only faces that are visible to armrest 604A (e.g., faces that are not obscured from armrest 604A's view). The computing platform may also obtain image data and color data 604B, which depicts a frame of data, obtained from the framebuffer, corresponding to a view of armrest 604A as seen from the camera perspective of armrest 602A. As can be seen, image 604B includes only faces that are visible to armrest 602A (e.g., faces that are not obscured from armrest 602A's view).

The computing platform may then proceed to perform a pixel analysis to determine which unique RGB values are present in the image and color data 602B and 604B. These RGB values represent the faces of each armrest 602A and 604A that are visible to and pointing toward the other armrest. The computing platform may then use those unique RGB values to identify the respective faces of each armrest 602A and 604A that are visible to (and pointing toward) armrest 604A and 602A, respectively.

After completing the Rendered Pixel Method optimization technique, the computing platform may have determined that 749 faces of armrest 602A are visible to armrest 604A, and 542 faces of armrest 604A are visible to armrest 602A. In this way, the Rendered Pixel Method optimization technique may significantly reduce the number of faces for which distance calculations need to be performed (e.g., by approximately 85%). The computing platform may then proceed to block 520 of the flow diagram 500 in FIG. 5 to apply the disclosed reduced-distances optimization technique, as described in more detail further below. After completing the additional optimization and calculations at blocks 520-524, the computing platform may determine the shortest distance and return the shortest distance to the construction professional. As shown in FIG. 6B, the computing platform may cause the client station to include, in the GUI view 600, a measurement 603 representing the shortest distance between armrest 602A and 604A.

Returning to FIG. 5, if the computing platform determines either (i) at block 504, that one or more of the two meshes representing the selected objects has less than the threshold number (e.g., 1,000) of faces, or (ii) at block 506, that one or more of the objects does not fit within the other object's view frustum, the computing platform may determine not to apply the Rendered Pixel Method and instead proceed to block 514. As described above, in some embodiments, the computing platform may determine to apply the Rendered Pixel Method with respect to only one of the two objects and then proceed to block 514. At block 514, the computing platform may proceed to implement the second disclosed reduced-faces optimization technique: the Face Normal Method.

At a high level, the Face Normal Method ("FNM") involves identifying those faces of each object that point toward the other object, and then performing the required distance calculations on only those faces to determine a shortest distance between the two objects. In this way, the FNM optimizes the existing approach for calculating a shortest distance by eliminating the need to perform calculations for those faces of an object that are facing away from the other object, as distances to points of the vertices/edges/faces of those faces are further away and thus unlikely to comprise the shortest distance between the two objects.

At block 516, the computing platform may begin the process of implementing the FNM optimization technique by determining which faces of the first object (e.g., the mesh representing the first object) are pointing toward the second object (e.g., the mesh representing the second object). The computing platform may do this by comparing (i) a direction (i.e., a direction vector) of the second object when pointing at the first object (e.g., a direction vector of the second object when the second object acts as a camera pointing toward the first object) and (ii) the respective face normal vector of each face of the first object. To determine the direction of the second object, the computing platform may use a viewing perspective technique similar to the one described above with respect to determining an object's view frustum (e.g., positioning a camera at the center of one object, pointing the camera toward the center of the other object, and determining the direction vector from the center of the one object toward the center of the other object). After determining the direction of the second object, the computing platform may next identify the faces of the first object that are pointing toward the second object (e.g., pointing toward the direction of the second object). To identify these faces, the computing platform may use the face normal vector information for each face of the first object.

In general, as mentioned above, a face normal of a given face is represented by a vector that is perpendicular to the given face and can be used to determine the direction (e.g., which way the face is pointing) of the given face. FIG. 7A depicts an example mesh 700 having a face 702A and corresponding face normal vector 702B, and a face 704A and corresponding face normal vector 704B. As shown in FIG. 7A, faces 702A and 704A point in different directions, as indicated by their respective face normal vectors 702B and 704B. In particular, the face normal vector can be used to determine, relative to a given object, if the given face is pointing generally toward or generally away from the given object by comparing the face normal vector of the given face to the direction of the given object. In a process referred to as face culling, faces that are pointing away from the given object can be culled (e.g., removed from consideration). While face culling is generally used during rendering procedures, the disclosed FNM optimization technique applies face culling to optimize distance calculations.

The computing platform may use respective face normal vector information about each face of the first object with respect to the direction of the second object. For example, one way the computing platform may do this is by obtaining a dot product of (i) the respective face normal vector of each face of the first object and (ii) the direction vector of the second object. If the dot product yields a negative value (e.g., an angle greater than 900 and less than or equal to 180°), the computing platform may determine that the given face of the first object is pointing toward the second object. If the dot product yields a positive value (e.g., an angle greater than 0° and less than 90°), the computing platform may determine that the given face of the first object is pointing away from the second object. In this way, the computing platform may evaluate the respective face normal of each face of the first object and identify those faces which are pointing toward the second object.

At block 518, the computing platform may repeat the function described above with respect to block 516 to determine which faces of the second object (e.g., the mesh representing the second object) are pointing toward the first object (e.g., the mesh representing the first object. For example, the computing platform may obtain a dot product of (i) the respective face normal vector of each face of the second object and (ii) the direction vector of the first object to identify those faces of the second object which are pointing toward the first object.

The faces of each object that are pointing toward the other object can be assumed to be the faces of each object that are closest in distance to each other. Therefore, distances calculated between these faces (e.g., distances calculated between the vertices, edges, and faces with respect to these identified faces) are most likely to comprise the shortest distance between the two objects. In this way, by identifying those faces of each object that point toward the other object, the computing platform may eliminate, from the set of faces on which distance calculations will be performed, those faces that are pointing away from each object, resulting in a decreases in overall computing time and providing a significantly enhanced user experience.

It should be understood that the functions described at blocks 516 and 518 may be performed in a reverse order, where the computing platform may first identify faces of the second object that are pointing toward the first object and next identify faces of the first object that are pointing toward the second object. Furthermore, at block 514, if the computing platform determines not to apply the FNM (e.g., if the computing platform is unable to access the face normal information from the BIM file, or if the face normal information is otherwise unavailable, among other possibilities) the computing platform may proceed directly to block 520 to implement the disclosed Unique Edges technique for optimizing calculation of the shortest distance by reducing the number of distances that need to be calculated.

To illustrate the Face Normal Method, FIG. 7B depicts a first object, represented by a mesh 710, and a second object, represented by a mesh 720, that may have been selected from a rendered three-dimensional view by a construction professional using the Measure tool 402 of FIGS. 4A-4C as described above. The first object may be a box and the second object may be a rounded pipe. In an embodiment where the initial RPM conditions are required, after receiving a request to calculate the distance between the box and the pipe, the computing platform may have determined that the mesh 710 has only 12 faces and thus, the RPM optimization technique may not be applied. The computing platform may then have proceeded to apply the Face Normal Method optimization technique as described above with respect to blocks 514-518 of FIG. 5.

As described above, the computing platform may identify the respective faces of each of the meshes 710 and 720 that point toward the other mesh using face normal vector information and direction vector information (that may be available from the BIM file). For example, based on the face normal vectors of the faces of the box 710 and the direction vector of the center of the pipe 720, the computing platform may determine that only two face normal vectors, face normal vector 712 and face normal vector 714, of the box 710 point toward the pipe 720. Therefore, the computing platform may identify two faces, outlined in FIG. 7B by a red box, of the box 710 as pointing toward the pipe 720. As a result, the computing platform may eliminate the remaining 10 faces of the box 710 from the total number of faces for which distances need to be calculated in order to determine the shortest distance between the box 710 and the pipe 720.

Next, based on the face normal vectors of the faces of the pipe 720 and the direction vector of the center of the box 710, the computing platform may determine that only the face normal vectors of the pipe 720 that are outlined by a red circle in FIG. 7B point toward the box 710. Therefore, the computing platform may identify the faces outlined by the red circle as pointing toward the box 710. As a result, the computing platform may eliminate the remaining thousands of faces of the pipe 720 from the total number of faces for which distances need to be calculated in order to determine the shortest distance between the box 710 and the pipe 720. The computing platform may then proceed to apply the disclosed reduced-distances Unique Edges optimization technique, as described in more detail below.

b. Reduced-Distances Optimization Technique

After applying a reduced-faces optimization technique as described above, or after determining not to apply a reduced-faces optimization technique, the computing platform may proceed to apply the disclosed reduced-distances optimization technique to reduce the overall number of distances that need to be calculated.

Returning to FIG. 5, at block 520, the computing platform may implement the disclosed Unique Edges optimization technique. As mentioned above, the existing approach for calculating edge-to-edge distances includes calculating distances for points along each edge of each face of each object. However, typically, each edge of a given face of an object is shared with a neighboring face. As a result, under the existing approach for calculating edge-to-edge distances, distances for points along a given edge are calculated twice—a first time while calculating distances for points along the given edge with respect to one neighboring face sharing the given edge, and a second time while calculating distances for points along the given edge with respect to the other neighboring face sharing the given edge.

Therefore, at block 522, the computing platform may perform calculations for only unique edge-to-edge distances. In other words, the computing platform may calculate distances to points along a shared edge that have not yet been calculated (e.g., calculate distances to points along a shared edge only a single time). By eliminating duplicate edge-to-edge distance calculations, the disclosed edge-to-edge optimization technique further reduces the total number of distances calculated, resulting in an additional decrease (e.g., approximately 50%) in overall computing time and providing a further enhanced user experience.

At block 524, based on the distances calculated as described above, the computing platform may return the measurement representing the shortest distance to the user. As described above with respect to FIG. 4C, the computing platform may do this by causing the user's client station to update the GUI view being presented to the user to show the measurement reflecting the shortest distance between the two selected objects.

The computing platform may determine the shortest distance measurement on a progressive basis with each distance measurement that is calculated. For example, after calculating a first shortest distance measurement, for each subsequently calculated new shortest distance measurement, the computing platform may compare the new shortest distance measurement with the most recently calculated shortest distance measurement to determine which distance is shorter. The shorter distance is then determined to be the current shortest distance between the two objects. Such a comparison may be made after every shortest distance measurement calculation to track the shortest distance throughout the calculation process until all of the required shortest distance measurement calculations are complete. After all of the required shortest distance measurement calculations are complete, the current shortest distance may be determined to be the final shortest distance between the two objects. In other embodiments, the computing platform may determine the shortest distance measurement after calculating all of the distances between the two objects as described above, and then comparing the distances calculated to determine which distance measurement (and corresponding pair of points) comprises the shortest distance between the two objects. The computing platform may keep track of or determine the shortest distance in other ways as well. The computing platform may then return the measurement representing the shortest distance to the user. As described above with respect to FIG. 4C, the computing platform may do this by causing the user's client station to update the GUI view presented to the user to show the measurement reflecting the shortest distance between the two selected objects.

By applying the reduced-faces and reduced-distances optimizations for calculating a shortest distance between two objects as disclosed above, the disclosed optimization techniques may reduce the overall computing time to determine the shortest distance from several minutes to less than a few seconds, effectively eliminating any perceived delay by a user between the time of selecting two objects in a three-dimensional view and requesting a shortest distance between the selected objects, and the time of receiving the shortest distance.

VI. Conclusion

Example embodiments of the disclosed innovations have been described above. Those skilled in the art will understand, however, that changes and modifications may be made to the embodiments described without departing from the true scope and spirit of the present invention, which will be defined by the claims.

For instance, those in the art will understand that the disclosed optimization techniques for calculating a shortest distance between two objects may be implemented in other areas. The disclosed software technology for calculating a shortest distance may be used in other ways as well.

Further, to the extent that examples described herein involve operations performed or initiated by actors, such as "humans," "operators," "users" or other entities, this is for purposes of example and explanation only. The claims should not be construed as requiring action by such actors unless explicitly recited in the claim language.

The invention claimed is:

1. A computing device comprising:
at least one processor;
at least one non-transitory computer-readable medium; and
program instructions stored on the at least one non-transitory computer-readable medium that are executable by the at least one processor such that the computing device is configured to:
receive a request for a shortest distance between a first object and a second object within a three-dimensional view that is being displayed via a user interface of the computing device, wherein each of the first and second objects comprises a respective mesh having a respective set of faces;
identify a set of distances that are to be calculated for determining the shortest distance between the first and second objects, wherein the set of distances is identified by one or both of:
(i) reducing a total number of faces for which distances are to be calculated based on at least one of visibility information or directional information of faces in each respective set of faces; or
(ii) reducing a total number of distances that are to be calculated based on edges that are shared by two or more faces;
calculate each distance in the identified set of distances; and
based on calculating each distance in the identified set of distances, determine the shortest distance between the first object and the second object.

2. The computing device of claim 1, wherein the three-dimensional view includes a set of two or more objects, the computing device further comprising program instructions stored on the at least one non-transitory computer-readable medium that are executable by the at least one processor such that the computing device is configured to:
enable selection of objects from the set of two or more objects; and
receive user input indicating selections of the first and second objects.

3. The computing device of claim 2, wherein the user input indicating the selections of the first and second objects comprises the request for the shortest distance between the first object and the second object.

4. The computing device of claim 1, further comprising program instructions stored on the at least one non-transitory computer-readable medium that are executable by the at least one processor such that the computing device is configured to:
generate the three-dimensional view using a three-dimensional model file that defines meshes representing physical objects in a real-world environment.

5. The computing device of claim 1, wherein the total number of faces for which distances are to be calculated is reduced based on visibility information indicating faces of each mesh that are visible to the other mesh, the computing device further comprising program instructions stored on the at least one non-transitory computer-readable medium that are executable by the at least one processor such that the computing device is configured to:
determine that the respective mesh of the first object (i) contains at least a threshold number of faces and (ii) fits within a view frustum of the respective mesh of the second object; and determine that the respective mesh of the second object (i) contains at least the threshold number of faces and (ii) fits within a view frustum of the respective mesh of the first object.

6. The computing device of claim 1, wherein the total number of faces for which distances are to be calculated is reduced based on visibility information indicating faces of each mesh that are visible to the other mesh, the computing device further comprising program instructions stored on the at least one non-transitory computer-readable medium that are executable by the at least one processor such that the computing device is configured to:
associate each face in each mesh's respective set of faces with a respective face identifier;
perform a pixel analysis of image data to identify which respective face identifiers are present in the image data; and
based on the pixel analysis, identify (i) a first subset of faces comprising faces of the respective mesh of the first object that are visible to the respective mesh of the second object and (ii) a second subset of faces comprising faces of the respective mesh of the second object that are visible to the respective mesh of the first object.

7. The computing device of claim 6, wherein the program instructions that are executable by the at least one processor such that the computing device is configured to perform the pixel analysis of the image data further comprise program instructions that are executable by the at least one processor such that the computing device is configured to:
obtain the image data from a framebuffer stored in the at least one non-transitory computer-readable medium.

8. The computing device of claim 6, wherein each respective face identifier comprises a unique color value.

9. The computing device of claim 1, wherein the total number of faces for which distances are to be calculated is reduced based on directional information indicating faces of each mesh that point toward the other mesh, the computing device further comprising program instructions stored on the at least one non-transitory computer-readable medium that are executable by the at least one processor such that the computing device is configured to:
identify faces of each respective mesh that point toward the other mesh based on (i) respective vector information for each face of the respective mesh and (ii) a direction of the other mesh.

10. The computing device of claim 9, wherein the respective vector information for each face of the respective mesh is obtained from a three-dimensional model file corresponding to the three-dimensional view.

11. The computing device of claim 1, wherein the total number of distances that are to be calculated is reduced based on edges that are shared by more than one face, the computing device further comprising program instructions stored on the at least one non-transitory computer-readable medium that are executable by the at least one processor such that the computing device is configured:
identify each respective edge that is shared by two or more faces; and
for each respective edge that is shared by two or more faces, identify a given one of the two or more faces for which distances between points on the respective edge and one or more points on another face are to be calculated.

12. The computing device of claim 1, further comprising program instructions stored on the at least one non-transitory computer-readable medium that are executable by the at least one processor such that the computing device is configured to:
display, in the three-dimensional view, a representation of the shortest distance between the first object and the second object.

13. The computing device of claim 12, wherein the representation of the shortest distance between the first object and the second object is a first representation, the computing device further comprising program instructions stored on the at least one non-transitory computer-readable medium that are executable by the at least one processor such that the computing device is configured to:
display, in the three-dimensional view, one or both of (i) a second representation of a lateral distance between the first object and the second object or (ii) a third representation of a vertical distance between the first object and the second object.

14. A non-transitory computer-readable medium, wherein the non-transitory computer-readable medium is provisioned with program instructions that, when executed by at least one processor, cause a computing device to:
receive a request for a shortest distance between a first object and a second object within a three-dimensional view that is being displayed via a user interface of the computing device, wherein each of the first and second objects comprises a respective mesh having a respective set of faces;
identify a set of distances that are to be calculated for determining the shortest distance between the first and second objects, wherein the set of distances is identified by one or both of:
(i) reducing a total number of faces for which distances are to be calculated based on at least one of visibility information or directional information of faces in each respective set of faces; or
(ii) reducing a total number of distances that are to be calculated based on edges that are shared by two or more faces;
calculate each distance in the identified set of distances; and
based on calculating each distance in the identified set of distances, determine the shortest distance between the first object and the second object.

15. The non-transitory computer-readable medium of claim 14, wherein the three-dimensional view includes a set of two or more objects, and wherein the non-transitory computer-readable medium is also provisioned with program instructions that, when executed by at least one processor, cause the computing device to:
enable selection of objects from the set of two or more objects; and
receive user input indicating selections of the first and second objects.

16. The non-transitory computer-readable medium of claim 15, wherein the user input indicating the selections of the first and second objects comprises the request for the shortest distance between the first object and the second object.

17. The non-transitory computer-readable medium of claim 14, wherein the non-transitory computer-readable medium is also provisioned with program instructions that, when executed by at least one processor, cause the computing device to:
generate the three-dimensional view using a three-dimensional model file that defines meshes representing physical objects in a real-world environment.

18. The non-transitory computer-readable medium of claim 14, wherein the total number of faces for which distances are to be calculated is reduced based on visibility information indicating faces of each mesh that are visible to the other mesh, and wherein the non-transitory computer-readable medium is also provisioned with program instructions that, when executed by at least one processor, cause the computing device to:
 determine that the respective mesh of the first object (i) contains at least a threshold number of faces and (ii) fits within a view frustum of the respective mesh of the second object; and
 determine that the respective mesh of the second object (i) contains at least the threshold number of faces and (ii) fits within a view frustum of the respective mesh of the first object.

19. The non-transitory computer-readable medium of claim 14, wherein the total number of faces for which distances are to be calculated is reduced based on visibility information indicating faces of each mesh that are visible to the other mesh, and wherein the non-transitory computer-readable medium is also provisioned with program instructions that, when executed by at least one processor, cause the computing device to:
 associate each face in each mesh's respective set of faces with a respective face identifier;
 perform a pixel analysis of image data to identify which respective face identifiers are present in the image data; and
 based on the pixel analysis, identify (i) a first subset of faces comprising faces of the respective mesh of the first object that are visible to the respective mesh of the second object and (ii) a second subset of faces comprising faces of the respective mesh of the second object that are visible to the respective mesh of the first object.

20. A method carried out by a computing device, the method comprising:
 receiving a request for a shortest distance between a first object and a second object within a three-dimensional view that is being displayed via a user interface of the computing device, wherein each of the first and second objects comprises a respective mesh having a respective set of faces;
 identifying a set of distances that are to be calculated for determining the shortest distance between the first and second objects, wherein the set of distances is identified by one or both of:
  (i) reducing a total number of faces for which distances are to be calculated based on at least one of visibility information or directional information of faces in each respective set of faces; or
  (ii) reducing a total number of distances that are to be calculated based on edges that are shared by two or more faces;
 calculating each distance in the identified set of distances; and
 based on calculating each distance in the identified set of distances, determining the shortest distance between the first object and the second object.

* * * * *